United States Patent
Wakazono et al.

(10) Patent No.: US 11,038,371 B2
(45) Date of Patent: Jun. 15, 2021

(54) POWER SUPPLY CONTROL DEVICE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Keisuke Wakazono, Mie (JP); Katsuma Tsukamoto, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 16/482,928

(22) PCT Filed: Jan. 25, 2018

(86) PCT No.: PCT/JP2018/002314
§ 371 (c)(1),
(2) Date: Aug. 1, 2019

(87) PCT Pub. No.: WO2018/150840
PCT Pub. Date: Aug. 23, 2018

(65) Prior Publication Data
US 2019/0356161 A1    Nov. 21, 2019

(30) Foreign Application Priority Data

Feb. 14, 2017 (JP) .............................. JP2017-025087

(51) Int. Cl.
*H02J 7/00* (2006.01)
*H03K 17/00* (2006.01)
(Continued)

(52) U.S. Cl.
CPC ............ *H02J 9/061* (2013.01); *H02J 7/0034* (2013.01); *H02J 7/0063* (2013.01); *H02J 7/0072* (2013.01); *H03K 17/687* (2013.01)

(58) Field of Classification Search
USPC ........................................................ 307/66
See application file for complete search history.

(56) References Cited

U.S. PATENT DOCUMENTS 5,898,557 A * 4/1999 Baba .................. H03K 17/0822
361/100
2013/0320986 A1* 12/2013 Shiraishi .............. G01R 31/327
324/415
(Continued)

FOREIGN PATENT DOCUMENTS

JP      H4-265639 A     9/1992
JP      2010-207061 A    9/2010
(Continued)

OTHER PUBLICATIONS

International Search Report, Application No. PCT/JP2018/002314, dated Feb. 27, 2018. ISA/Japan Patent Office.

*Primary Examiner* — Rexford N Barnie
*Assistant Examiner* — Xuan Ly
(74) *Attorney, Agent, or Firm* — Honigman LLP

(57) ABSTRACT

Provided is a power supply control device. The power supply control device includes a plurality of semiconductor switches that are connected in parallel between two power sources and control the supply of power to a load that is connected to the two power sources via the plurality of semiconductor switches, the power supply control device including a temperature detection unit that detects a rise of temperature due to heat that is produced from at least one of the plurality of semiconductor switches, and a switching control unit that executes control that switches the plurality of semiconductor switches from OFF to ON if the temperature detection unit detects a temperature that is at least a threshold temperature.

4 Claims, 4 Drawing Sheets

(51) Int. Cl.
*H03K 17/08* (2006.01)
*H03K 17/687* (2006.01)
*H02J 9/06* (2006.01)

(56) References Cited

U.S. PATENT DOCUMENTS

2016/0301202 A1  10/2016  Tsukamoto et al.
2019/0252908 A1*  8/2019  Takita .................... B60R 16/02

FOREIGN PATENT DOCUMENTS

| | | |
|---|---|---|
| JP | 2013-236297 A | 11/2013 |
| WO | 2011-052606 A1 | 5/2011 |
| WO | 2011-152086 A1 | 12/2011 |

* cited by examiner

POWER SUPPLY CONTROL DEVICE

CROSS-REFERENCE TO RELATED APPLICATIONS

This application is the U.S. national stage of PCT/JP2018/002314 filed on Jan. 25, 2018, which claims priority of Japanese Patent Application No. JP 2017-025087 filed on Feb. 14, 2017, the contents of which are incorporated herein.

TECHNICAL FIELD

The present disclosure relates to a power supply control device.

BACKGROUND

Vehicles are provided with power supply control devices that control the supply of power from batteries to loads by switching switches, which are provided on power supply paths from the batteries to the loads, ON or OFF (for example, see JP 2013-236297A).

The power supply control device disclosed in JP 2013-236297A includes a switch unit that has two MOSFETs (Metal-Oxide Semiconductor Field-Effect Transistors) that are connected in parallel and are provided on power supply paths from a battery to a load. With the power supply control device according to JP 2013-236297A, the supply of power to the load is controlled by switching these MOSFETs ON or OFF.

If a short-circuit occurs on the anode side of parasitic diodes of FETs in a power source relay circuit that has FETs connected in parallel and power sources and loads connected to both ends of the FETs, it is preferable that the FETs are switched OFF and the flow of current is stopped in order to maintain the source voltage on the anode side. However, if there is a short-circuit on the anode side of the parasitic diodes of the FETs in a state in which a half-on failure occurs in one of the FETs, there is concern that switching the FETs OFF will cause current to concentrate in the FET in which the half-on failure has occurred and that this FET will generate excessive heat.

With JP 2013-236297A, half-on failures are detected from the voltage between the drains and the sources of the FETs, but with a power source relay circuit that has FETs of which both ends have a power source connected thereto, there is a problem that half-on failures cannot be detected from the voltage between the drains and sources of the FETs.

An object of the present disclosure is to provide a power supply control device that can detect a half-on failure even if both ends of a semiconductor switch have a power source connected thereto.

SUMMARY

A power supply control device according to an aspect of the present application includes a plurality of semiconductor switches that are connected in parallel between two power sources and control the supply of power to a load that is connected to the two power sources via the plurality of semiconductor switches, the power supply control device including a temperature detection unit that detects a rise of temperature due to heat that is produced from at least one of the plurality of semiconductor switches, and a switching control unit that executes control that switches the plurality of semiconductor switches from OFF to ON if the temperature detection unit detects a temperature that is at least a threshold temperature.

With the aspect described above, even if both the drain side and the source side of the semiconductor switch has a power source connected thereto, it is possible to detect a half-on failure without detecting the voltage between the drain and source of the semiconductor switch. Also, when a half-on failure is detected, control is executed that switches all semiconductor switches from OFF to ON, allowing current to flow to the semiconductor switches in which a half-on failure has not occurred, if any, thus avoiding concentration of current in the semiconductor switch in which a half-on failure has occurred. As a result, it is possible to prevent the semiconductor switches from burning out due to an excessive rise in temperature.

The power supply control device according to an aspect of the present application further includes a relay contact that is connected in parallel to the plurality of semiconductor switches, wherein, if the relay contact is OFF, the switching unit executes control that switches the relay contact from OFF to ON if the temperature detection unit detects a temperature that is at least the threshold temperature.

With the aspect described above, when a half-on failure is detected, control is executed that switches the relay contact from OFF to ON so current can flow through the relay contact, thus avoiding concentration of current in the semiconductor switch in which a half-on failure has occurred. As a result, it is possible to prevent the semiconductor switches from burning out due to an excessive rise in temperature.

The power supply control device according to an aspect of the present application is the power supply control device wherein the semiconductor switch is an FET, one of the two power sources is connected to a drain of each of the semiconductor switches and the other of the two power sources is connected to a source of each of the semiconductor switches, the power supply control device further comprises a reverse flow detection unit that detects a current that flows from the one power source to the drains of the semiconductor switches, and if at least one of the plurality of semiconductor switches is ON, the switching control unit executes control that switches the at least one of the semiconductor switches to OFF if the reverse flow detection unit has detected the current.

With the aspect described above, it is possible to switch all of the semiconductor switches from ON to OFF if reverse-flowing current is detected, that is, current flowing from the drains to the sources of the semiconductor switches.

Advantageous Effects of Disclosure

According to the above description, a half-on failure can be detected even if both ends of a semiconductor switch have a power source connected thereto.

DETAILED DESCRIPTION OF PREFERRED EMBODIMENTS

Figure 1:
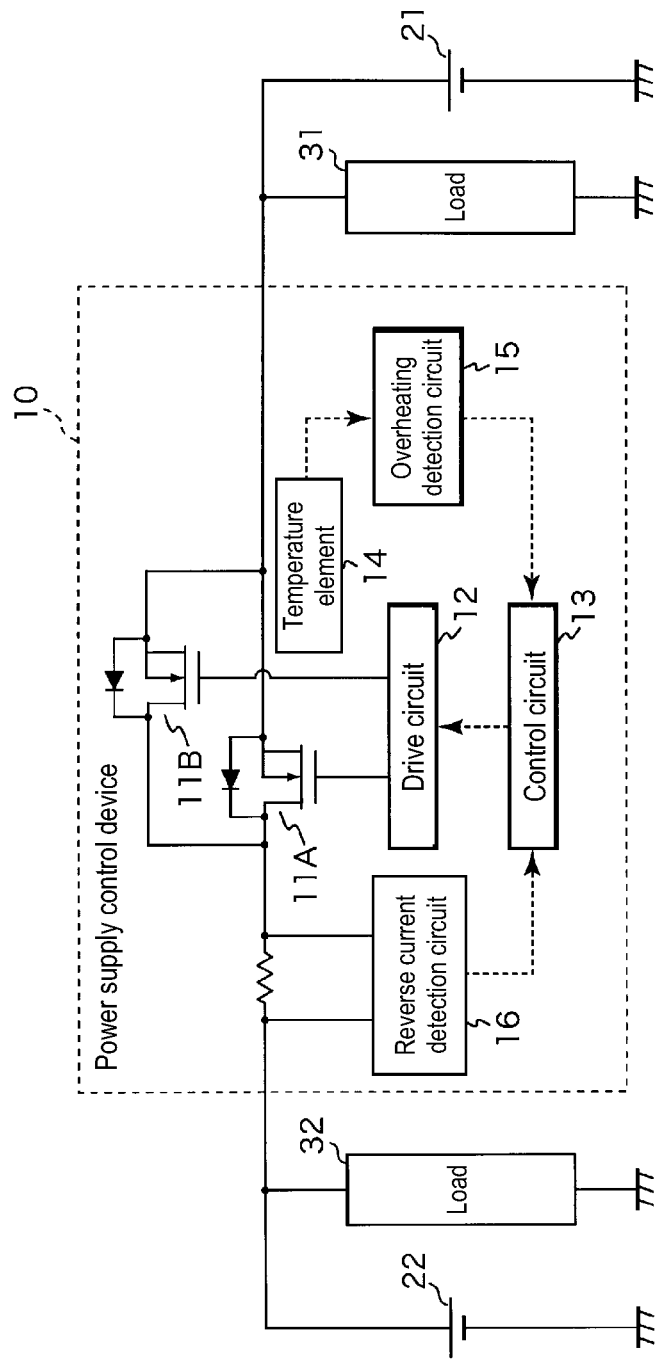
FIG. 1 is a circuit diagram illustrating a power source system according to a first embodiment.

The following lists and describes embodiments of the present disclosure. Also, at least parts of the embodiments described below may also be combined as appropriate.

A power supply control device according to an aspect of the present application includes a plurality of semiconductor switches that are connected in parallel between two power sources and control the supply of power to a load that is connected to the two power sources via the plurality of semiconductor switches, the power supply control device including a temperature detection unit that detects a rise of temperature due to heat that is produced from at least one of the plurality of semiconductor switches, and a switching control unit that executes control that switches the plurality of semiconductor switches from OFF to ON if the temperature detection unit detects a temperature that is at least a threshold temperature.

With the aspect described above, even if both the drain side and the source side of the semiconductor switch has a power source connected thereto, it is possible to detect a half-on failure without detecting the voltage between the drain and source of the semiconductor switch. Also, when a half-on failure is detected, control is executed that switches all semiconductor switches from OFF to ON, allowing current to flow to the semiconductor switches in which a half-on failure has not occurred, if any, thus avoiding concentration of current in the semiconductor switch in which a half-on failure has occurred. As a result, it is possible to prevent the semiconductor switches from burning out due to an excessive rise in temperature.

The power supply control device according to an aspect of the present application further includes a relay contact that is connected in parallel to the plurality of semiconductor switches, wherein, if the relay contact is OFF, the switching unit executes control that switches the relay contact from OFF to ON if the temperature detection unit detects a temperature that is at least the threshold temperature.

With the aspect described above, when a half-on failure is detected, control is executed that switches the relay contact from OFF to ON so current can flow through the relay contact, thus avoiding concentration of current in the semiconductor switch in which a half-on failure has occurred. As a result, it is possible to prevent the semiconductor switches from burning out due to an excessive rise in temperature.

The power supply control device according to an aspect of the present application is the power supply control device wherein the semiconductor switch is an FET, one of the two power sources is connected to a drain of each of the semiconductor switches and the other of the two power sources is connected to a source of each of the semiconductor switches, the power supply control device further comprises a reverse flow detection unit that detects a current that flows from the one power source to the drains of the semiconductor switches, and if at least one of the plurality of semiconductor switches is ON, the switching control unit executes control that switches the at least one of the semiconductor switches to OFF if the reverse flow detection unit has detected the current.

With the aspect described above, it is possible to switch all of the semiconductor switches from ON to OFF if reverse-flowing current is detected, that is, current flowing from the drains to the sources of the semiconductor switches.

The following specifically describes the present disclosure based on drawings that show embodiments thereof.

First Embodiment

FIG. 1 is a circuit diagram illustrating a power source system according to a first embodiment. The power source system according to the first embodiment may be installed in a vehicle for example, and includes a power supply control device 10, a main battery 21, an sub auxiliary battery 22, and loads 31 and 32.

The main battery 21 has a cathode that is connected to the load 31 and the power supply control device 10, and supplies power to the load 31 as well as supplying power to the load 32 via the power supply control device 10. Note that the anode of the main battery 21 is grounded. The loads 31 and 32 may be electronic apparatuses such as a starter motor, a vehicle light, a wiper, or an air conditioner. The loads 31 and 32 are configured to operate when power is supplied thereto from the main battery 21 (or the auxiliary battery 22), and to stop operating when the supply of power from the main battery 21 (or the auxiliary battery 22) stops. A signal indicating whether or not the loads 31 and 32 are operating is input from, for example, a body ECU (Electronic Control Unit) (not shown) to the power supply control device 10. The power supply control device 10 executes power supply control on the main battery 21 and the auxiliary battery 22 based on the signal that is input from the body ECU, for example.

The power supply control device 10 includes semiconductor switches 11A and 11B, a drive circuit 12, a control circuit 13, a temperature element 14, an overheating detection circuit 15, and a reverse flow detection circuit 16.

The semiconductor switches 11A and 11B may be, for example, N-channel FETs that are connected in parallel between the main battery 21 and the auxiliary battery 22. The sources of the semiconductor switches 11A and 11B are connected to the cathode of the main battery 21, and the drains of the semiconductor switches 11A and 11B are connected to the cathode of the auxiliary battery 22. Also, the gates of the semiconductor switches 11A and 11B are connected to the drive circuit 12.

Note that with the present embodiment, the power supply control device 10 includes two semiconductor switches 11A and 11B, but it may also include three or more semiconductor switches.

The drive circuit 12 switches the semiconductor switches 11A and 11B ON or OFF substantially simultaneously by adjusting the voltage value of the gates of the semiconductor switches 11A and 11B. A control signal for switching the semiconductor switches 11A and 11B ON or OFF is input from the control circuit 13 to the drive circuit 12.

Figure 2:
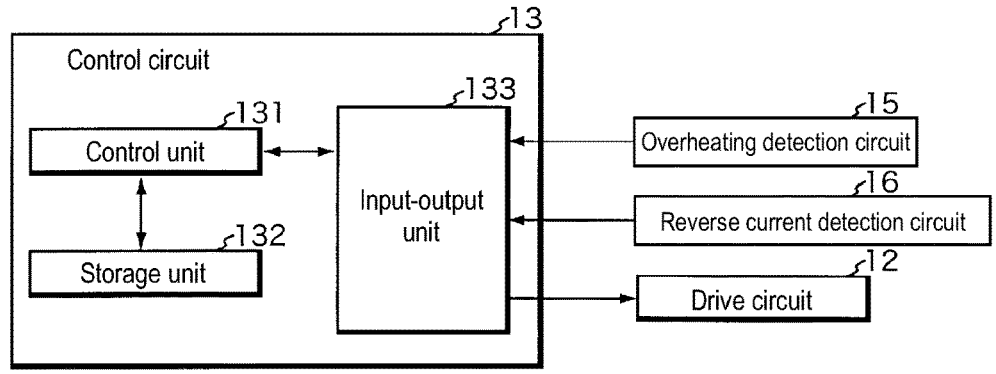
FIG. 2 is a block diagram illustrating an internal configuration of a control circuit.

FIG. 2 is a block diagram illustrating an internal configuration of the control circuit 13. The control circuit 13 may include, for example, a control unit 131, a storage unit 132, and an input-output unit 133, and outputs to the drive circuit 12 a control signal to switch the semiconductor switches 11A and 11B ON or OFF.

The control unit 131 may include, for example, a CPU (Central Processing Unit), ROM (Read Only Memory), RAM (Random Access Memory), and the like. The CPU included in the control unit 131 executes a control program, which is stored in advance on the RAM, to control the operation of hardware units included in the control circuit 13 and realize switching control of the semiconductor switches 11A and 11B. Specifically, the control unit 131 outputs a control signal for switching the semiconductor switches 11A and 11B ON or OFF through the input-output unit 133 to the drive circuit 12 in order to realize the switching control of the semiconductor switches 11A and 11B. Also, whenever the control unit 131 outputs the control signal described above, the control unit 131 also keeps track of the ON or OFF control state of the semiconductor switches 11A and 11B by writing information about the control signal to the RAM for example.

The input-output unit 133 includes an interface that connects various circuits. In the present embodiment, the drive circuit 12, the overheating detection circuit 15, and the reverse flow detection circuit 16 are all connected to the input-output unit 133. The input-output unit 133 obtains detection results that have been output from the overheating detection circuit 15 and the reverse flow detection circuit 16, and the obtained detection results are then output to the control unit 131. Also, if the control signal to switch the semiconductor switches 11A and 11B ON or OFF is obtained from the control unit 131, the input-output unit 133 outputs the obtained control signal to the drive circuit 12.

Furthermore, the input-output unit 133 may also include a communication interface that communicates with an apparatus such as a body ECU in accordance with a communication protocol such as CAN (Controller Area Network). In such a case, the control unit 131 may also obtain, through a communication interface included in the input-output unit 133, a signal from an ECU or the like instructing the loads 31 and 32 to start or stop operating.

The overheating detection circuit 15 uses the temperature element 14 to detect a temperature rise caused by least one of the semiconductor switches 11A and 11B producing heat. The temperature element 14 is a thermal sensor such as a thermistor whose resistance value changes in accordance with ambient temperature, and is arranged in the vicinity of the two semiconductor switches 11A and 11B. With the present embodiment, it is sufficient that the overheating detection circuit 15 can detect temperature rising in accordance with heat being produced when a half-on failure occurs in the semiconductor switch 11A (or the semiconductor switch 11B), and the temperature element 14 is mounted on the same substrate on which, for example, the two semiconductor switches 11A and 11B are mounted.

The overheating detection circuit 15 has a memory (not shown) that stores a threshold temperature (80° C., for example) that has been set lower than the upper temperature limit (140° C. to 175° C., for example) of the semiconductor switches 11A and 11B, and if the ambient temperature shown by the temperature element 14 is at least the threshold temperature, then the control circuit 13 outputs a detection result conveying that information to the control circuit 13.

Note that in the present embodiment, the overheating detection circuit 15 detects temperature rises due to heat being produced when a half-on failure occurs, but a configuration is also possible in which the temperature element 14 is connected to the input-output unit 133 of the control circuit 13, and thus the control unit 131 of the control circuit 13 detects temperature rises due to heat being produced when a half-on failure occurs. In such a case, a temperature threshold value is stored in the storage unit 132. The control unit 131 can detect whether or not the temperature has risen to at least the threshold temperature by comparing the temperature measured through the temperature element 14 to the temperature threshold value stored in the storage unit 132.

The reverse flow detection circuit 16 is interposed between the cathode of the auxiliary battery 22 and the drains of the semiconductor switches 11A and 11B, and detects current that is about to flow from the auxiliary battery 22 to the load 31 via the power supply control device 10. If the reverse flow detection circuit 16 detects current flowing from the cathode of the auxiliary battery 22 toward the drains of the semiconductor switches 11A and 11B (reverse current), then the reverse flow detection circuit 16 outputs a detection result conveying that information to the control circuit 13.

Figure 3:
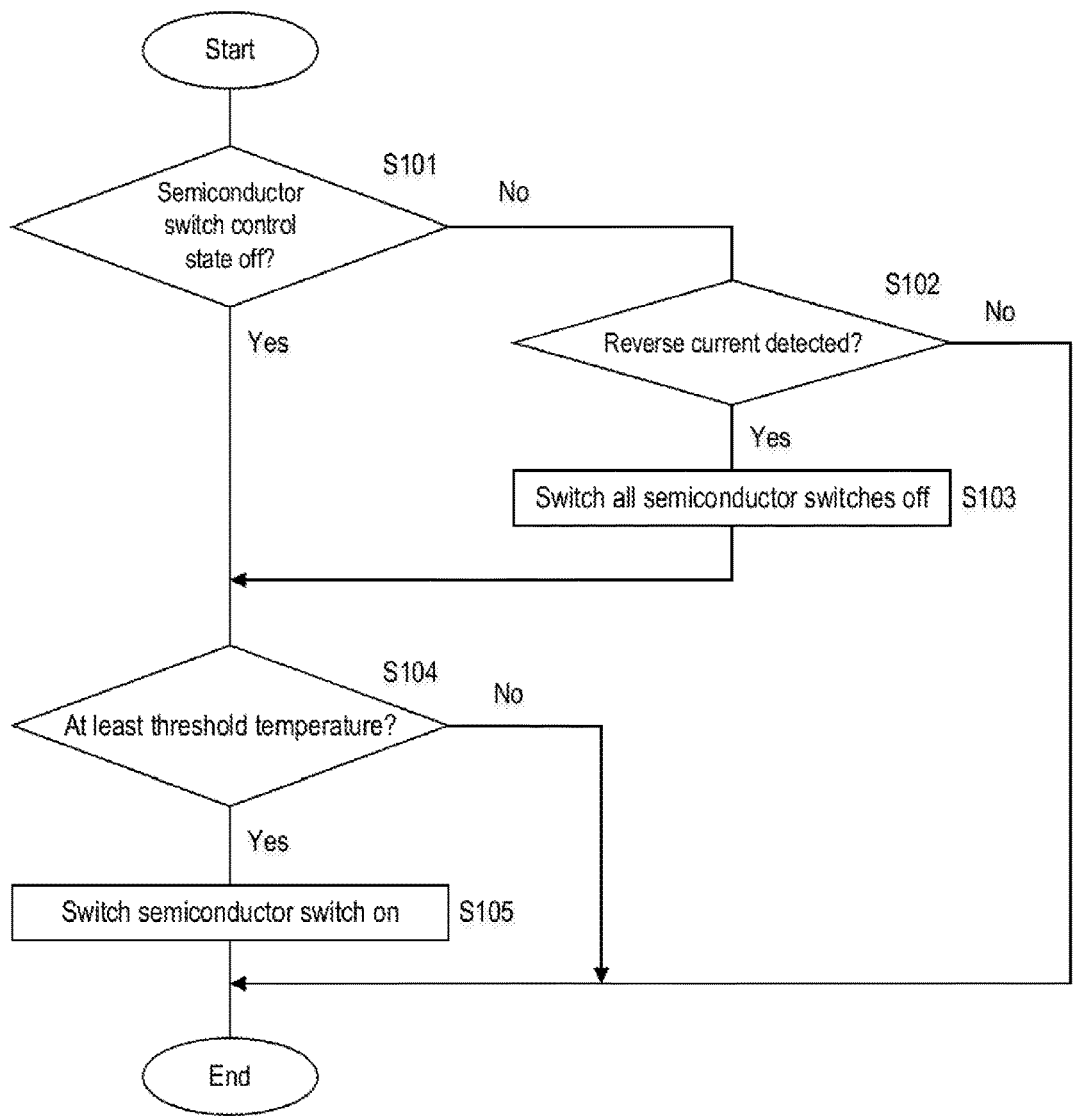
FIG. 3 is a flowchart illustrating steps of processing that are executed by the control circuit according to the first embodiment.

The following describes the operation of the power supply control device 10. FIG. 3 is a flowchart illustrating steps of processing that are executed by the control circuit 13 according to the first embodiment. The control unit 131 of the control circuit 13 executes the following processing at periodic timing if, for example, an IG switch of a vehicle is ON. The control unit 131 determines whether or not the two semiconductor switches 11A and 11B included in the power supply control device 10 are turned OFF (step S101). The control unit 131 keeps track of the ON or OFF control states of the semiconductor switches 11A and 11B and therefore can determine whether or not the semiconductor switches 11A and 11B are turned OFF by referencing the information that it keeps track of.

If it is determined that the semiconductor switches 11A and 11B are not turned OFF (S101: NO), the control unit 131 determines whether or not a current (reverse current) has been detected flowing in a direction from the cathode of the auxiliary battery 22 to the drains of the semiconductor switches 11A and 11B, based the detection result from the reverse flow detection circuit 16 that is input through the input-output unit 133 (step S102). If it is determined that a reverse flow has not been detected (S102: NO), the control unit 131 ends the processing of this flowchart without executing the processing below.

If it is determined that reverse flow has been detected (S102: YES), the control unit 131 outputs a control signal to the drive circuit 12 to switch all of the semiconductor switches 11A and 11B OFF, and all of the semiconductor switches 11A and 11B are thus switched OFF through the drive circuit 12 (step S103).

If it is determined in step S101 that the semiconductor switches 11A and 11B are turned OFF (S101: YES), or if all of the semiconductor switches 11A and 11B are switched OFF in step S103, the control unit 131 determines whether or not a temperature of at least the threshold temperature has been detected by the overheating detection circuit 15, based on the detection result from the overheating detection circuit 15, the result being output through the input-output unit 133 (step S104). If a temperature of at least the threshold temperature is not detected by the overheating detection circuit 15 (S104: NO), the control unit 131 ends the processing of this flowchart.

If it is determined that a temperature of at least the threshold temperature has been detected by the overheating detection circuit 15 (S104: YES), it is possible that a half-on failure has occurred in at least one of the semiconductor switches 11A and 11B, and therefore the control unit 131 outputs a control signal to the drive circuit 12 to switch the semiconductor switches 11A and 11B from OFF to ON and executes control that switches the semiconductor switches 11A and 11B to ON (step S105). With this control, it is possible to switch the semiconductor switch 11A (or the semiconductor switch 11B), in which a half-on failure has not occurred, to ON, thus avoiding concentration of current in the semiconductor switch 11B (or the semiconductor switch 11A) in which a half-on failure has occurred, and preventing an excessive rise in temperature.

As described above, with the first embodiment, even if power sources (the main battery 21 and the auxiliary battery 22 in the present embodiment) are connected to both the drain side and the source side of the semiconductor switches 11A and 11B, it is possible to detect a half-on failure without detecting the voltage between the drains and sources of the semiconductor switches 11A and 11B. Also, when a half-on failure is detected, the semiconductor switches 11A and 11B are switched ON, so current can flow to the semiconductor switch 11A (or the semiconductor switch 11B) if a half-on failure has not occurred in the semiconductor switch 11A (or the semiconductor switch 11B), and thus it is possible to avoid concentration of current in the semiconductor switch 11B (or the semiconductor switch 11A) in which a half-on failure has occurred, and to prevent semiconductor switches from burning out due to an excessive rise in temperature.

Second Embodiment

The second embodiment describes a configuration that further includes a relay contact 11C that is connected in parallel in relation to the semiconductor switches 11A and 11B.

Figure 4:
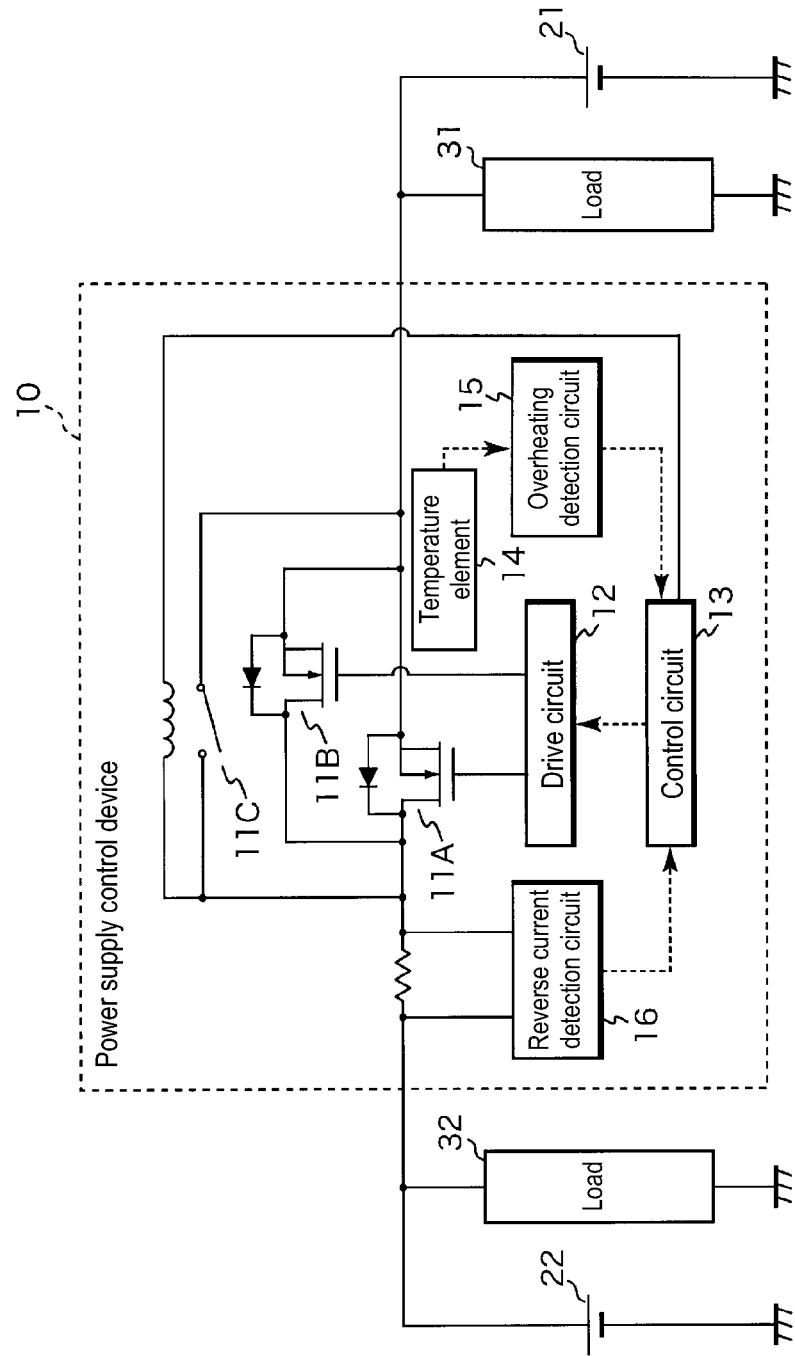
FIG. 4 is a circuit diagram illustrating the power source system according to a second embodiment.

FIG. 4 is a circuit diagram illustrating the power source system according to the second embodiment. The power source system according to the second embodiment includes the power supply control device 10, the main battery 21, the auxiliary battery 22, and the loads 31 and 32, all of which may be installed in a vehicle for example. The power supply control device 10 includes the semiconductor switches 11A and 11B, the drive circuit 12, the control circuit 13, the temperature element 14, the overheating detection circuit 15, and the reverse flow detection circuit 16, and further includes a relay contact 11C.

The relay contact 11C is connected in parallel to the two semiconductor switches 11A and 11B, and has a NO terminal, a COM terminal, and a relay segment. In the example shown in FIG. 4, the NO terminal of the relay contact 11C is connected to the drains of the semiconductor switches 11A and 11B, and the COM terminal is connected to the sources of the semiconductor switches 11A and 11B.

The relay contact 11C is provided with a relay coil whose one end is connected to the control circuit 13. If the one end of the relay coil is open, then current flows through the relay coil and the relay segment is separated from the NO terminal. At this time, no current flows between the NO terminal and the COM terminal, and the relay contact 11C is OFF. On the other hand, if the one end of the relay coil is grounded, then current flows from the control circuit 13 to the relay coil, and a magnetic field forms around the relay coil. Thus, the relay segment is attracted the NO terminal, and the relay segment and the NO terminal come into contact. At this time, the relay contact 11C is ON and current flows between the NO terminal and the COM terminal of the relay contact 11C.

Figure 5:
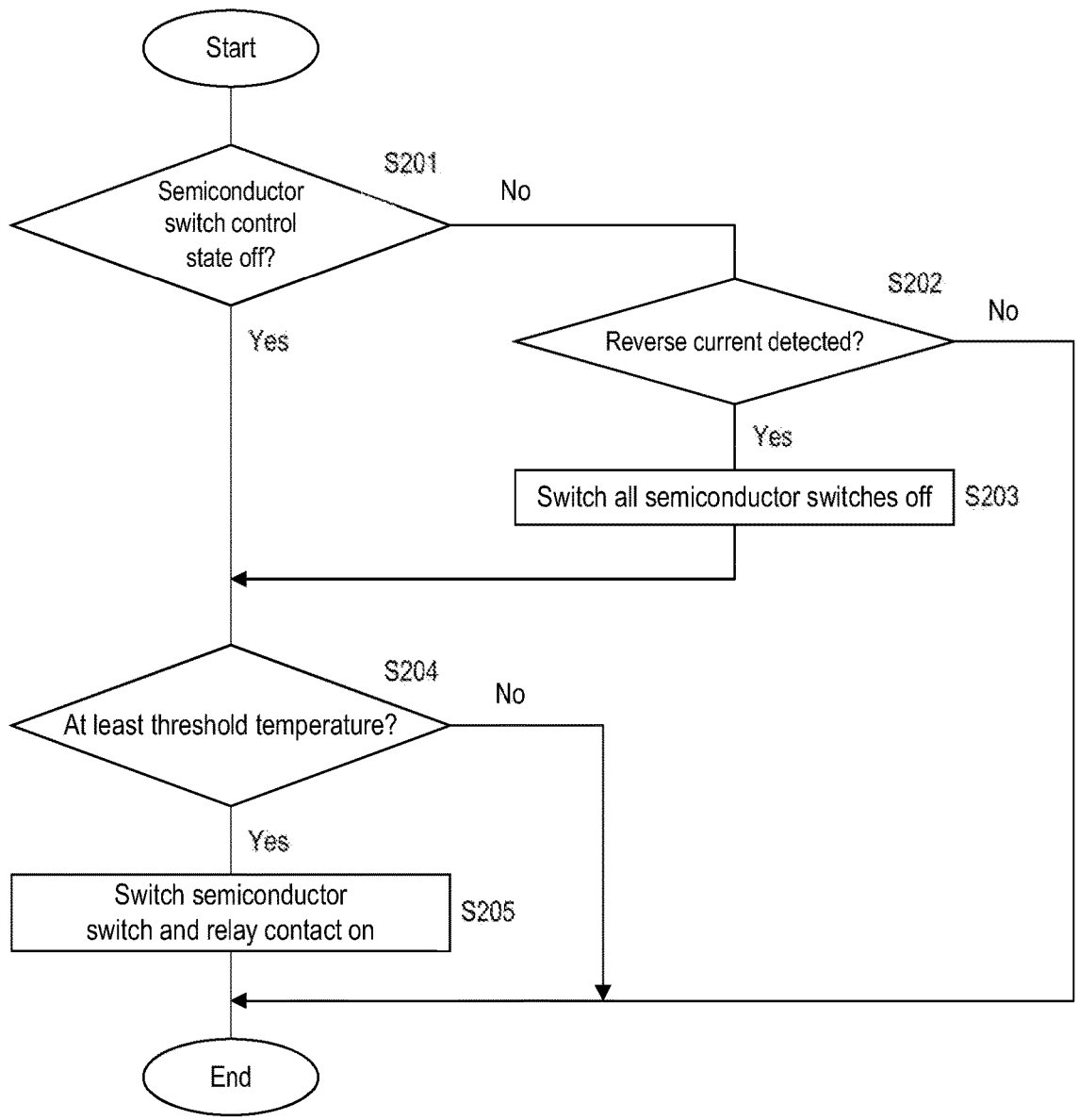
FIG. 5 is a flowchart illustrating steps of processing that are executed by the control circuit according to the second embodiment.

FIG. 5 is a flowchart illustrating steps of processing that are executed by the control circuit 13 according to the second embodiment. The control unit 131 of the control circuit 13 executes the following processing at periodic timing if, for example, an IG switch of the vehicle is ON. The control unit 131 determines whether or not the two semiconductor switches 11A and 11B, which are included in the power supply control device 10 (step S201), are turned OFF. The control unit 131 keeps track of the ON or OFF control states of the semiconductor switches 11A and 11B and therefore can determine whether or not the control states of the semiconductor switches 11A and 11B are turned OFF by referencing the information that it keeps track of.

If it is determined that the semiconductor switches 11A and 11B are not OFF (S201: NO), the control unit 131 determines whether or not a current (reverse current) has been detected flowing in a direction from the cathode of the auxiliary battery 22 to the drains of the semiconductor switches 11A and 11B, based on the detection result from the reverse flow detection circuit 16 that is input through the input-output unit 133 (step S202). If it is determined that a reverse current is not detected (S202: NO), the control unit 131 ends processing of this flowchart without executing the processing below.

If it is determined that reverse flow has been detected (S202: YES), the control unit 131 outputs a control signal to the drive circuit 12 to switch all of the semiconductor switches 11A and 11B OFF, and all of the semiconductor switches 11A and 11B are thus switched OFF through the drive circuit 12 (step S203).

If it is determined in step S201 that the semiconductor switches 11A and 11B are turned OFF (S201: YES), or if all of the semiconductor switches 11A and 11B have been switched to OFF in step S203, the control unit 131 determines whether or not a temperature of at least the threshold temperature has been detected by the overheating detection circuit 15, based on the detection result from the overheating detection circuit 15, the result being output through the input-output unit 133 (step S204). If a temperature of at least the threshold temperature is not detected by the overheating detection circuit 15 (S204: NO), then the control unit 131 ends the processing of this flowchart.

If it is determined that a temperature of at least the threshold temperature has been detected by the overheating detection circuit 15 (S204: YES), then it is possible that a half-on failure has occurred in at least one of the semiconductor switches 11A and 11B, and therefore the control unit 131 outputs a control signal to the drive circuit 12 to switch the semiconductor switches 11A and 11B ON, executes control through the drive circuit 12 to switch the semiconductor switches 11A and 11B OFF, and turns the relay contact 11C OFF by allowing current to flow to the relay coil that is provided in the relay contact 11C (step S205). With these controls, it is possible to switch the semiconductor switch 11A (or the semiconductor switch 11B), in which a half-on failure has not occurred, and the relay contact 11C to ON, thus avoiding concentration of current in the semiconductor switch 11B (or the semiconductor switch 11A) in which a half-on failure has occurred, and preventing an excessive rise in temperature.

As described above, with the second embodiment, even if power sources (the main battery 21 and the auxiliary battery 22 in the present embodiment) are connected to both the drain side and the source side of the semiconductor switches 11A and 11B, it is possible to detect a half-on failure without detecting the voltage between the drains and sources of the semiconductor switches 11A and 11B. Also, if a half-on failure is detected, the semiconductor switches 11A and 11B and the relay contact 11C are turned ON, current can flow to the semiconductor switch 11A (or the semiconductor switch 11B) in which a half-on failure has not occurred and the relay contact 11C, and thus it is possible to avoid the case where current concentrates in the semiconductor switch 11B (or the semiconductor switch 11A) in which a half-on failure has occurred, and to prevent semiconductor switches from burning out due to an excessive rise in temperature.

The embodiments disclosed herein are examples in all respects, and are not to be construed as limiting. The scope of the present disclosure is defined by the scope of the claims rather than the meaning of the foregoing description, and all modifications equivalent to, and within the scope of, the claims are intended to be encompassed therein.

The invention claimed is:

1. A power supply control device including a plurality of semiconductor switches that are connected in parallel between two power sources and controlling the supply of power to a load that is connected to the two power sources via the plurality of semiconductor switches, the power supply control device comprising:
   a temperature detection unit that detects a rise of temperature due to heat that is produced from at least one of the plurality of semiconductor switches; and
   a switching control unit that executes control that switches all of the plurality of semiconductor switches from OFF to ON when the temperature detection unit detects a temperature that is at least a threshold temperature so as to allow current to flow to the semiconductor switch of the plurality of semiconductor switches in which a half-on failure has not occurred, thus avoiding a concentration of current in the semiconductor switch of the plurality of semiconductor switches in which a half-on failure has not occurred.

2. The power supply control device according to claim 1, further comprising: a relay contact that is connected in parallel to the plurality of semiconductor switches, wherein
   if the relay contact is OFF, the switching control unit executes control that switches the relay contact from OFF to ON if the temperature detection unit detects a temperature that is at least the threshold temperature.

3. The power supply control device according to claim 1, wherein:
   the semiconductor switch is an FET,
   one of the two power sources is connected to a drain of each of the semiconductor switches and the other of the two power sources is connected to a source of each of the semiconductor switches,
   the power supply control device further comprises a reverse flow detection unit that detects a current that flows from the one power source to the drains of the semiconductor switches, and
   if at least one of the plurality of semiconductor switches is ON, the switching control unit executes control that switches the at least one of the semiconductor switches to OFF if the reverse flow detection unit has detected the current.

4. The power supply control device according to claim 2, wherein:
   the semiconductor switch is an FET,
   one of the two power sources is connected to a drain of each of the semiconductor switches and the other of the two power sources is connected to a source of each of the semiconductor switches,
   the power supply control device further comprises a reverse flow detection unit that detects a current that flows from the one power source to the drains of the semiconductor switches, and
   if at least one of the plurality of semiconductor switches is ON, the switching control unit executes control that switches the at least one of the semiconductor switches to OFF if the reverse flow detection unit has detected the current.

* * * * *